US012690396B2

(12) United States Patent
Sung et al.

(10) Patent No.: US 12,690,396 B2
(45) Date of Patent: Jul. 21, 2026

(54) PHASE CHANGE HETEROSTRUCTURE, AND PHASE CHANGE MEMORY DEVICE INCLUDING THE SAME

(71) Applicant: Samsung Electronics Co., Ltd., Suwon-si (KR)

(72) Inventors: Hajun Sung, Suwon-si (KR); Youngjae Kang, Suwon-si (KR); Changyup Park, Hwaseong-si (KR); Kiyeon Yang, Suwon-si (KR); Wooyoung Yang, Suwon-si (KR); Changseung Lee, Suwon-si (KR); Minwoo Choi, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 733 days.

(21) Appl. No.: 18/068,821

(22) Filed: Dec. 20, 2022

(65) Prior Publication Data

US 2024/0065118 A1 Feb. 22, 2024

(30) Foreign Application Priority Data

Aug. 18, 2022 (KR) ........................ 10-2022-0103560

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/84* (2023.02); *H10N 70/861* (2023.02); *H10N 70/8828* (2023.02); *H10N 70/8845* (2023.02)

(58) Field of Classification Search
CPC ........... H10N 70/8828; H10N 70/8845; H10N 70/882; H10N 70/841; H10N 70/861;

(Continued)

(56) References Cited

U.S. PATENT DOCUMENTS 7,361,925 B2 * 4/2008 Happ ................ H10N 70/8616
257/3
7,638,789 B2 12/2009 Peters
(Continued)

FOREIGN PATENT DOCUMENTS

CN 113517396 A 10/2021
KR 100767333 B1 10/2007
(Continued)

OTHER PUBLICATIONS

Keyuan Ding et al., 'Phase-change heterostructure enables ultralow noise and drift for memory operation' *Science*, vol. 366, Oct. 2019, pp. 210-215.

(Continued)

*Primary Examiner* — Moazzam Hossain
(74) *Attorney, Agent, or Firm* — HARNESS, DICKEY & PIERCE, P.L.C

(57) ABSTRACT

Provided are a phase change heterostructure and a phase change memory device including the same. The phase change memory device including the phase change hetero-structure may include a plurality of memory cells. Each of the plurality of memory cells may include a first electrode and a second electrode, which may be spaced apart from each other, and a phase change heterostructure between the first electrode and the second electrode. The phase change heterostructure may include a plurality of phase change material layers and a plurality of thermal barrier layers alternately stacked on each other. A material of the plurality of thermal barrier layers have a thermal conductivity lower than a materials of the plurality of phase change material layers.

18 Claims, 7 Drawing Sheets

(58) Field of Classification Search
CPC ............. H10N 70/8616; H10N 70/231; H10N 70/826; H10B 63/84; H10B 63/00; H10B 63/20
See application file for complete search history.

(56) References Cited

U.S. PATENT DOCUMENTS

| | | | |
|---|---|---|---|
| 7,864,567 B2 | 1/2011 | Gordon et al. | |
| 9,379,321 B1 | 6/2016 | Chang et al. | |
| 9,704,921 B2 | 7/2017 | Kim et al. | |
| 9,748,311 B2 | 8/2017 | Fantini et al. | |
| 10,062,840 B2 | 8/2018 | Sim et al. | |
| 10,084,017 B2 | 9/2018 | Ohba et al. | |
| 10,163,977 B1 | 12/2018 | Fantini et al. | |
| 10,186,552 B2 | 1/2019 | Choi et al. | |
| 10,374,009 B1 | 8/2019 | Cheng et al. | |
| 2007/0272987 A1 | 11/2007 | Kang et al. | |
| 2014/0345843 A1* | 11/2014 | Kirkor | F28F 21/02 |
| | | | 165/185 |
| 2017/0170237 A1 | 6/2017 | Jung | |
| 2017/0237000 A1 | 8/2017 | Terai et al. | |

| | | | |
|---|---|---|---|
| 2019/0043924 A1* | 2/2019 | Conti | H10B 63/24 |
| 2019/0115392 A1* | 4/2019 | Bruce | H10B 63/84 |
| 2019/0131520 A1 | 5/2019 | Morin et al. | |
| 2019/0148456 A1 | 5/2019 | Wu et al. | |
| 2019/0267543 A1* | 8/2019 | Katono | H10N 70/026 |
| 2021/0066586 A1* | 3/2021 | Ode | G11C 13/0004 |
| 2021/0091307 A1 | 3/2021 | BrightSky et al. | |
| 2023/0363299 A1* | 11/2023 | Zhong | H10N 70/066 |

FOREIGN PATENT DOCUMENTS

| | | | |
|---|---|---|---|
| KR | 2014/0030606 A | 3/2014 | |
| KR | 2014/0078156 A | 6/2014 | |
| KR | 2017/0069893 A | 6/2017 | |
| KR | 101935348 B1 | 4/2019 | |
| KR | 2019/0098423 A | 8/2019 | |

OTHER PUBLICATIONS

Korean Office Action dated Dec. 12, 2025 for corresponding Korean Patent Application No. 10-2022-0103560 and its English-language translation.

* cited by examiner

PHASE CHANGE HETEROSTRUCTURE, AND PHASE CHANGE MEMORY DEVICE INCLUDING THE SAME

CROSS-REFERENCE TO RELATED APPLICATION

This application is based on and claims priority under 35 U.S.C. § 119 to Korean Patent Application No. 10-2022-0103560, filed on Aug. 18, 2022 in the Korean Intellectual Property Office, the disclosure of which is incorporated by reference herein in its entirety.

BACKGROUND

1. Field

The present disclosure relates to a phase change hetero-structure and a phase change memory device including the same, in which the phase change heterostructure enables fabrication of the low-power phase change memory device by reducing the power required to operate the phase change memory device.

2. Description of the Related Art

Recently, with the miniaturization and high performance of electronic devices, memory devices capable of storing information in various electronic devices, such as computers and portable communication devices may be required. These memory devices may include resistive random access memory (RRAM), phase change random access memory (PRAM), magnetic random access memory (MRAM), and the like, which may store data using a characteristic of switching between different resistance states according to an applied voltage or current.

Among them, there may be a need to reduce the power consumption required for phase change according to the operation of the PRAM. Specifically, a low-power phase change memory device that reduces a reset operation current of the phase change memory device has been studied.

SUMMARY

Provided is a phase change heterostructure having power consumption reduction characteristics for a reset operation of a phase change memory device.

Provided is a memory device including a phase change heterostructure having power consumption reduction characteristics for a reset operation of a phase change memory device.

However, features and aspects of inventive concepts are not limited to those discussed above.

Additional aspects will be set forth in part in the description which follows and, in part, will be apparent from the description, or may be learned by practice of the presented embodiments of the disclosure.

According an embodiment, a phase change heterostructure may include a plurality of phase change material layers and a plurality of thermal barrier layers alternately stacked on each other. A thermal conductivity of a material of the plurality of thermal barrier layers may be lower than a thermal conductivity of a material of the plurality of phase change material layers.

In some embodiments, the plurality of thermal barrier layers may include a chalcogenide material having a composition of $AB_2$. In the composition $AB_2$, A may be a metal element, and B may be a chalcogen element.

In some embodiments, in the composition $AB_2$, A may include at least one of Ti, Zr, Hf, Ta, Mo, and W.

In some embodiments, in the composition $AB_2$, B may include at least one of Te, Se, and S.

In some embodiments, the thermal conductivity of the plurality of thermal barrier layers may be 2% to 10% of the thermal conductivity of the material of the plurality of phase change material layers.

In some embodiments, the plurality of thermal barrier layers may include a material having a thermal conductivity of lower than 1 W/mK.

In some embodiments, each of the plurality of thermal barrier layers may have a thickness of 2 nm or more and 10 nm or less.

In some embodiments, the plurality of phase change material layers may include at least one of $Sb_2Te_3$ and $Ge_2Sb_2Te_5$.

In some embodiments, the plurality of phase change material layers may include at least one of $Sb_2Te_3$ and $Ge_2Sb_2Te_5$. The plurality of phase change material layers may further include a carbon dopant.

In some embodiments, each of the plurality of phase change material layers may have a thickness of 2 nm or more and 10 nm or less.

According to an embodiment, a phase change memory device may include a plurality of memory cells. Each of the plurality of memory cells may include a first electrode, a second electrode spaced apart from the first electrode, and a phase change heterostructure between the first electrode and the second electrode. The phase change heterostructure may include a plurality of phase change material layers and a plurality of thermal barrier layers alternately stacked on each other. A thermal conductivity of a material of the plurality of thermal barrier layers may be lower than a thermal conductivity of a material of the plurality of phase change material layers.

In some embodiments, the phase change memory device may have a three-dimensional (3D) cross point array structure.

In some embodiments, each of the plurality of memory cells may further include a switching element connected in series with the phase change heterostructure.

In some embodiments, the phase change memory device may have a vertically stacked structure.

In some embodiments, the plurality of thermal barrier layers may include a chalcogenide material having a composition of $AB_2$, wherein A may be a metal element, and B may be a chalcogen element.

In some embodiments, in the composition $AB_2$, A may include at least one of Ti, Zr, Hf, Ta, Mo, and W.

In some embodiments, in the composition $AB_2$, B may include at least one of Te, Se, and S.

In some embodiments, the thermal conductivity of the plurality of thermal barrier layers may be 2% to 10% of the thermal conductivity of the material of the plurality of phase change material layers.

In some embodiments, the thermal conductivity of the material of the plurality of thermal barrier layers may include a material having a thermal conductivity of lower than 1 W/mK.

In some embodiments, each of the plurality of thermal barrier layers may have a thickness of 2 nm or more and 10 nm or less.

In some embodiments, the plurality of phase change material layers may include at least one of $Sb_2Te_3$ and $Ge_2Sb_2Te_5$.

In some embodiments, the plurality of phase change material layers may include at least one of $Sb_2Te_3$ and $Ge_2Sb_2Te_5$. The plurality of phase change material layers may further include a carbon dopant.

In some embodiments, the first electrode and the second electrode may independently include at least one of carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
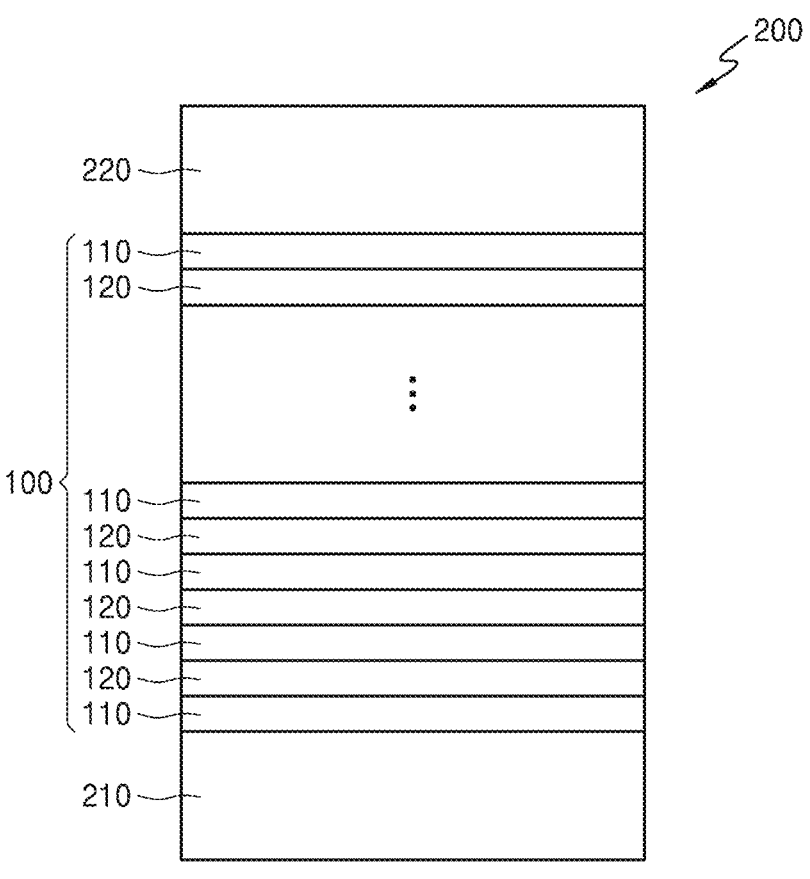
FIG. 1 is a cross-sectional view of a phase change memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, example embodiments will be described in detail with reference to the accompanying drawings. In the following drawings, the same reference numerals refer to the same components, and the size of each component in the drawings may be exaggerated for clarity and convenience of description. Meanwhile, the embodiments described below are merely examples, and various modifications are possible from these embodiments.

Hereinafter, the term "upper portion" or "on" may also include "to be present above, below, or to the left or right on a non-contact basis" as well as "to be on the top portion, the bottom portion, or to the left or right in direct contact with". Singular expressions include plural expressions unless they are explicitly meant differently in context. In addition, when a part "includes" a component, this means that it may include more other components, rather than excluding other components, unless otherwise stated.

The use of the term "the" and similar indicative terms may correspond to both singular and plural. If there is no explicit description or contrary description of the steps constituting the method, these steps may be carried out in an appropriate order and are not necessarily limited to the stated order.

Further, the terms "unit", "module" or the like mean a unit that processes at least one function or operation, which may be implemented in hardware or software or implemented in a combination of hardware and software.

The connection or connection members of lines between the components shown in the drawings exemplarily represent functional connection and/or physical or circuit connections, and may be replaceable or represented as various additional functional connections, physical connections, or circuit connections in an actual apparatus.

The use of all examples or example terms is simply for describing a technical idea in detail and the scope is not limited by these examples or example terms unless limited by the claims.

FIG. 1 is a cross-sectional view of a phase change memory device according to another embodiment.

Referring to FIG. 1, a phase change memory device 200 may include: a phase change heterostructure 100 including a phase change material layer 110 and a thermal barrier layer 120; a first electrode 210; and a second electrode 220. The first and second electrodes 210 and 220 are vertically spaced apart from each other, and the phase change heterostructure 100 including a plurality of phase change material layers 110 and a plurality of thermal barrier layers 120 may be arranged between the first electrode 210 and the second electrode 220.

The phase change heterostructure 100 may include the phase change material layers 110 and the thermal barrier layers 120, which are alternately stacked on each other. However, the phase change heterostructure 100 may include only one phase change material layer and one thermal barrier layer. The phase change heterostructure 100 may be included in the phase change memory device 200. The phase change material layers 110 and the thermal barrier layers 120, which are alternately stacked, are elements capable of reducing power consumption by the phase change memory device 200, which will be described in detail below.

The thermal barrier layers 120 may include a chalcogenide material having a composition of $AB_2$ wherein A is a metal element, and B is a chalcogen element.

The chalcogenide material is a compound consisting of at least one group 16 (chalcogen) element and at least one electropositive element. The chalcogenide material has a property of changing quickly into a crystalline state and an amorphous state as heat is applied. In the crystalline state, optical reflectivity is high and electrical resistance is low, whereas in the amorphous state, reflectivity is low and electrical resistance is high, so the two states are set to 1 and 0, respectively, and are used as recording materials for DVD-RAM (using reflectivity difference) or PRAM (using resistance difference).

The thermal barrier layers 120 according to an embodiment may include a material having a thermal conductivity lower than 1 W/mK. Among the $AB_2$ chalcogenide materials of the thermal barrier layers 120, element A may include at least one of Ti, Zr, Hf, Ta, Mo, and W. In addition, element B of the thermal barrier layers 120 may include at least one of Te, Se, and S.

The thermal barrier layers 120 may include a material having a thermal conductivity of 2% or more to 10% or less of the thermal conductivity of the material of the phase change material layers 110. That is, the thermal conductivity of each of the thermal barrier layers 120 is significantly lower than that of each of the phase change material layers 110. The low thermal conductivity of each of the thermal barrier layers will be described below.

Each of the thermal barrier layers 120 may have a structure of $AB_2$, and elements A and B may be arranged in a vertical structure. The plurality of thermal barrier layers 120 may form layers each having an $AB_2$ composition and there is a vertical van der Waals gap between the layers. The van der Waals gap may include an air gap, the gap between layers may reduce heat transfer power between layers, and the gap may serve to reduce thermal conductivity of each of the heat barrier layers 120.

In other words, each of the thermal barrier layers 120 has a lower thermal conductivity in the vertical direction (Out-of-plane, K_zz direction) than in the horizontal direction (In-plane, K_xx direction), so as to serve as a thermal barrier layer.

As the material forming each of the thermal barrier layers 120 described above, element A of the $AB_2$ chalcogenide material may include at least one of Ti, Zr, Hf, Ta, Mo, and W, and element B may include at least one of Te, Se, and S. In particular, when each of the thermal barrier layers 120 includes a Ta-based chalcogenide material, it has the lowest thermal conductivity among the mentioned chalcogenide materials.

The thermal conductivities in the K_xx direction and the K_zz direction for each chalcogenide material are specifically shown in Table 1.

TABLE 1

| [AB₂ Thermal conductivity] | | | |
|---|---|---|---|
| A | B | K_xx [W/m · k] | K_zz [W/m · k] |
| Ti | Te | 1.91 | 0.37 |
| | Se | 1.94 | 0.32 |
| | S | 2.33 | 0.49 |
| Zr | Te | 2.06 | 0.62 |
| | Se | 1.94 | 0.37 |
| | S | 3.15 | 0.81 |

TABLE 1-continued

| [AB₂ Thermal conductivity] | | | |
|---|---|---|---|
| A | B | K_xx [W/m · k] | K_zz [W/m · k] |
| Hf | Te | 1.66 | 0.49 |
| | Se | 1.73 | 0.39 |
| | S | 3.42 | 0.71 |
| Ta | Te | 0.15 | 0.03 |
| | Se | 0.05 | 0.01 |
| | S | 0.07 | 0.02 |
| Mo | Te | 6.45 | 1.31 |
| | Se | 13.49 | 1.39 |
| | S | 31.86 | 2.29 |
| W | Te | 6.55 | 1.32 |
| | Se | 14.71 | 1.34 |
| | S | 55.26 | 2.40 |

Referring to Table 1, thermal conductivities of element A and element B of the $AB_2$ chalcogenide material in the horizontal direction and in the vertical direction may be found. Most of the thermal barrier layers of the $AB_2$ structure, including the chalcogenide material, have shown lower thermal conductivities in the vertical direction (Out-of-plane, K_zz direction) than in the horizontal direction (In-plane, K_xx direction).

In particular, Table 1 shows that, when element A is Ta, thermal conductivity in the vertical direction (K_zz direction) is the lowest.

The phase change material layer 110 according to an embodiment may be alternately stacked on the thermal barrier layer 120, or the plurality of phase change material layers may be alternately stacked on the plurality of thermal barrier layers.

Each of the phase change material layers 110 may include at least one of $Sb_2Te_3$ and $Ge_2Sb_2Te_5$. In addition, the phase change material layers may include at least one of $Sb_2Te_3$ and $Ge_2Sb_2Te_5$, which further include a carbon dopant.

Figure 2:
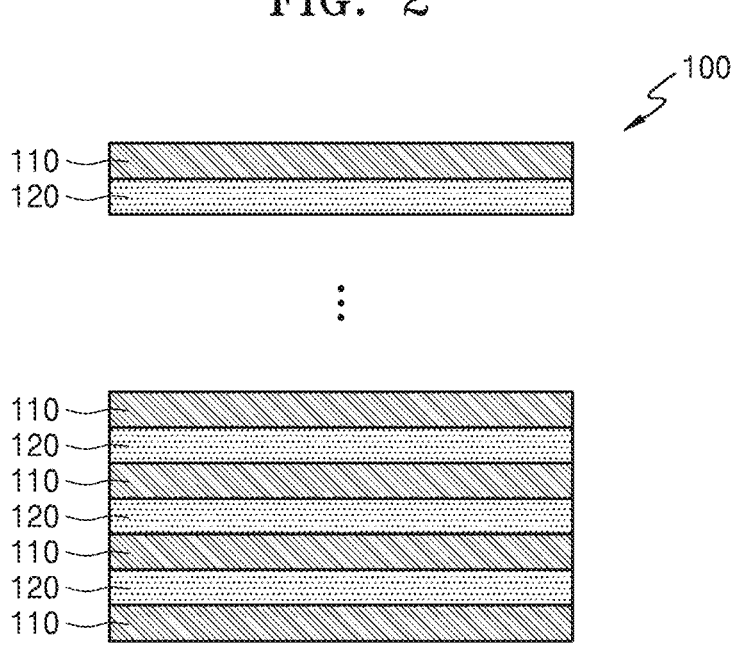
FIG. 2 is a diagram illustrating, in detail, an internal structure of a phase change heterostructure according to an embodiment.

FIG. 2 is a diagram illustrating, in detail, an internal structure of a phase change heterostructure according to an embodiment.

Referring to FIG. 2, each of the phase change material layers 110 and each of the thermal barrier layers 120, which are alternately stacked on each other, may have the same thickness, but they do not necessarily have to have the same thickness.

The thickness of each of the heat barrier layers may be 2 nm or more to 10 nm or less, and the thickness of each of the phase change material layers may be 2 nm or more to 10 nm or less.

Figure 3:
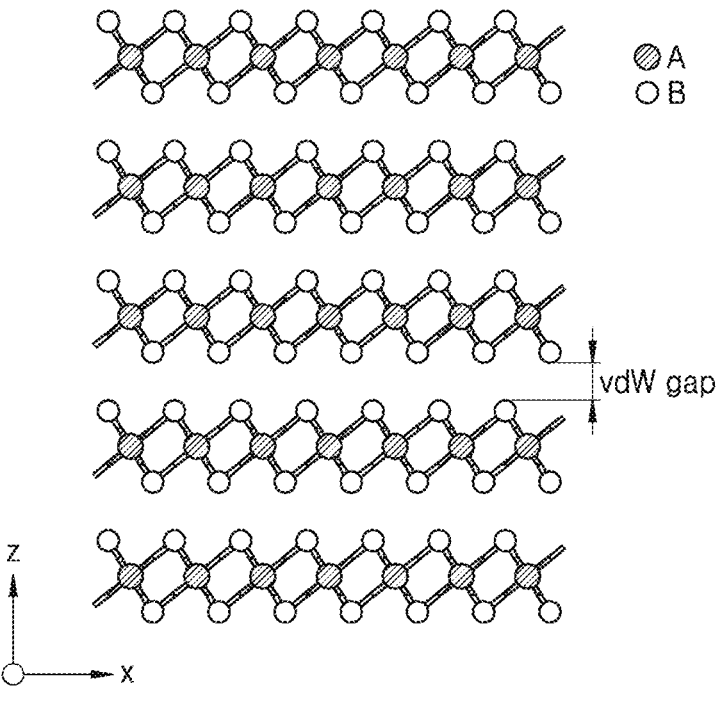
FIG. 3 is a diagram for illustrating, in detail, an $AB_2$ structure of thermal barrier layers according to an embodiment.

FIG. 3 is a diagram for illustrating, in detail, the $AB_2$ structure of thermal barrier layers according to an embodiment.

Referring to FIG. 3, as mentioned above, the thermal barrier layers 120 have a structure of $AB_2$, and element A and element B may be arranged in a vertical structure. The plurality of thermal barrier layers 120 may form layers each having an $AB_2$ composition and there is a vertical van der Waals gap between the layers. The van der Waals gap may include an air gap, the gap between layers may reduce heat transfer power between layers, and the gap may serve to reduce thermal conductivity of each of the heat barrier layers 120.

Figure 4:
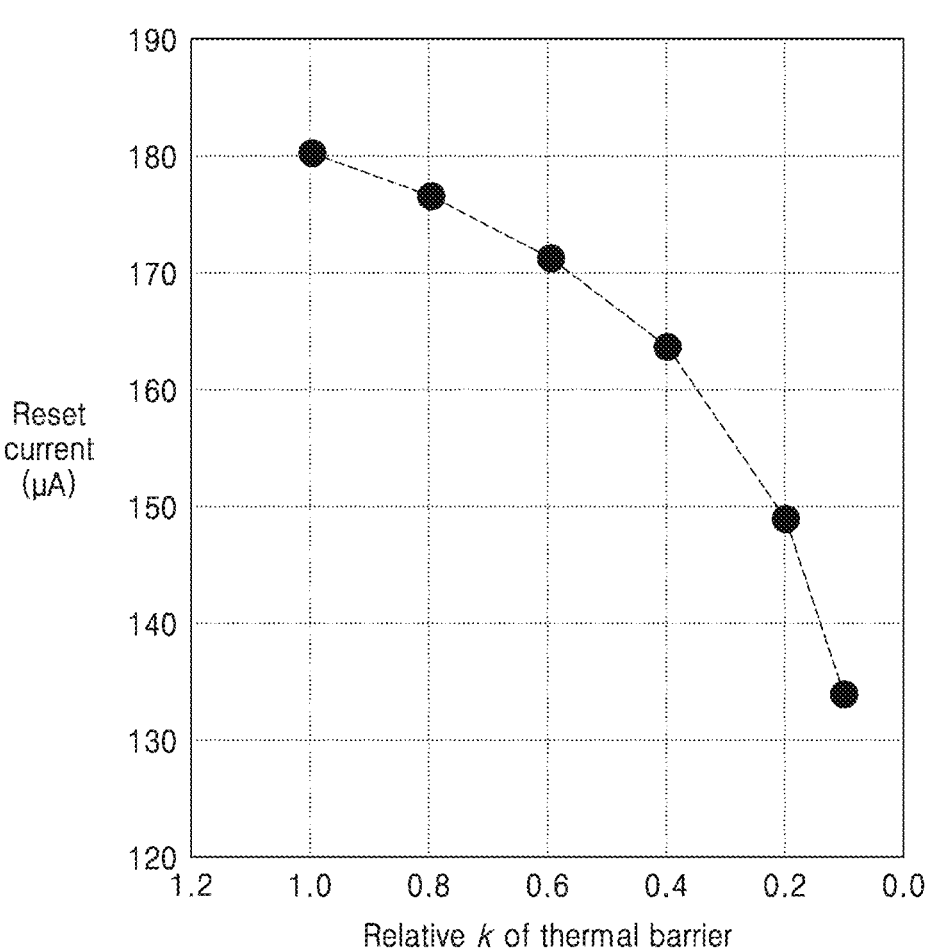
FIG. 4 is a graph illustrating a change in current consumption of a phase change memory device according to a change in thermal conductivity of a thermal barrier layer.

FIG. 4 is a graph illustrating a change in current consumption of a phase change memory device according to a change in thermal conductivity of a thermal barrier layer.

Referring to FIG. 4, the correlation between the power consumption of a reset process and the thermal conductivity of the thermal barrier layer when the phase change memory device 200 operates may be seen.

A phase change random access memory (PRAM) is a memory device that utilizes the difference in resistance according to a change in a state of a material. The PRAM employs a method of storing data as 0 and 1 depending on a state, in which when a current is applied to a specific material such as germanium, antimony, telluride, or the like, the specific material becomes a solid state if the resistance is weak and a liquid state if the resistance is strong.

A write operation of the phase change memory device is divided into a reset operation and a set operation. The process of changing from an amorphous state to a crystalline state is defined as a set operation, which is a process of storing data as 1. Conversely, the process of changing from a crystalline state to an amorphous state is defined as a reset operation, which is a process of storing data as zero.

A typical phase change memory device basically may have a lower electrode, a phase change material layer, and an upper electrode, and may have a vertical arrangement structure in which they are vertically connected. In this structure, a contact area between the phase change material layer and the lower electrode may be made as small as possible, so that the current density on two contact surfaces may be rapidly increased, and Joule heating may be generated using the rapidly increasing current density. When the temperature due to this generated Joule heat exceeds the phase-transition temperature of the phase change material, the state of the memory changes. In other words, it may be possible to reduce the magnitude of the current consumption required for phase change by controlling Joule heat escaping to the upper and lower electrodes for low-power driving of the PRAM.

As the thermal conductivity constant (k) of the thermal barrier layer may decrease, the thermal conductivity in the vertical direction (K_zz direction) of the thermal barrier layer may decrease, which may decrease the size of Joule heat escaping to the upper and lower electrodes, thus reducing the amount of a reset current consumed when the phase change memory device operates.

Figure 5:
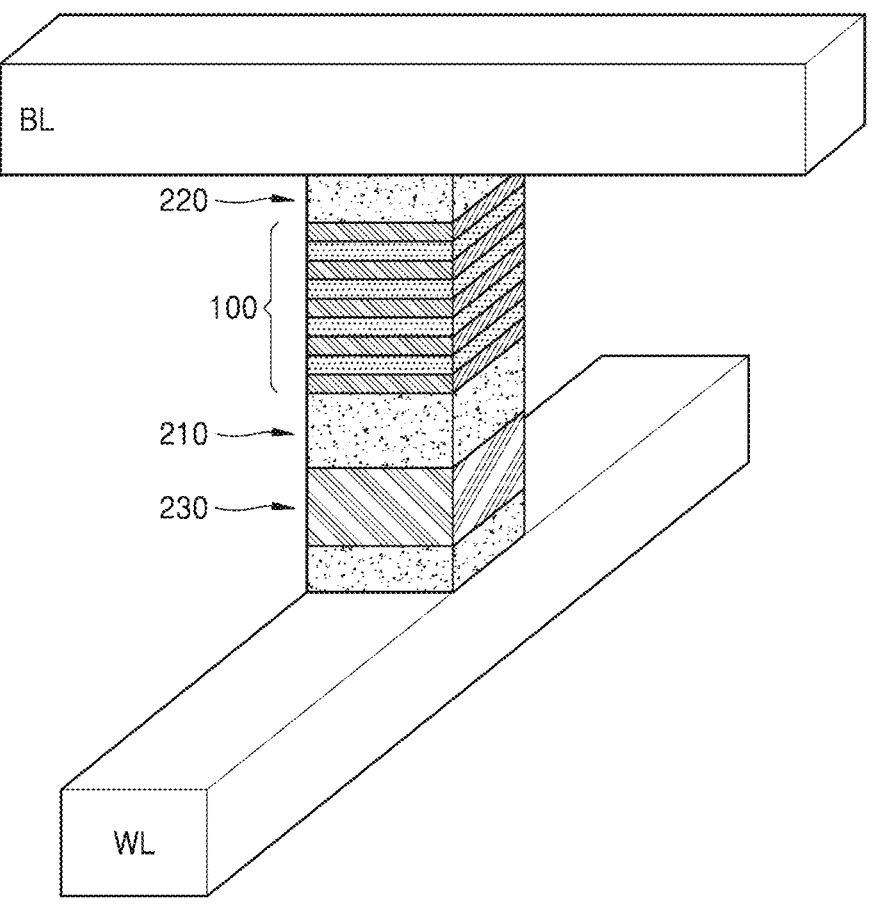
FIG. 5 is a perspective view illustrating a three-dimensional structure of a phase change memory device according to an embodiment.

FIG. 5 is a perspective view illustrating a three-dimensional structure of a phase change memory device according to an embodiment.

The phase change memory device 200 may include a plurality of memory cells and may have a three-dimensional (3D) cross point array structure.

Referring to FIG. 5, a 3D structure of the phase change memory device 200 is illustrated in an example of a memory cell.

The phase change memory device 200 may include a plurality of memory cells, and each memory cell may include a first electrode 210, a second electrode 220, and a phase change heterostructure 100 which is arranged between the first electrode 210 and the second electrode 220, and includes a plurality of phase change material layers 110 and a plurality of thermal barrier layers 120, which are alternately stacked on each other. In addition, as described above, the thermal barrier layers 120 may have a lower thermal conductivity than the phase change material layers 110.

Each memory cell may further include a switching element 230 provided to be connected in series with the phase change heterostructure 100.

Each memory cell is provided with the switching element 230, which is a selector element, to limit and/or prevent the occurrence of a sneak current in a memory device having a 3D cross-point array structure, such as a phase change RAM (PRAM) or a resistive RAM (RRAM). The phase change memory device having a 3D cross point array structure will be described below.

The switching element 230 may include a switching material layer (not shown). The switching material layer may have a circular cross-section, but is not limited thereto. The switching material layer is provided to cover a side surface of a core part, and may further include a shell part including a material having an electrical resistance higher than that of the core part.

The first electrode 210 and the second electrode 220 may be formed of conductive materials. For example, each conductive material may be made of a metal, a conductive metal oxide, a conductive metal nitride, or a combination thereof. For example, each conductive material may include one or more selected from carbon (C), titanium nitride (TiN), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), but is not limited thereto.

Figure 6:
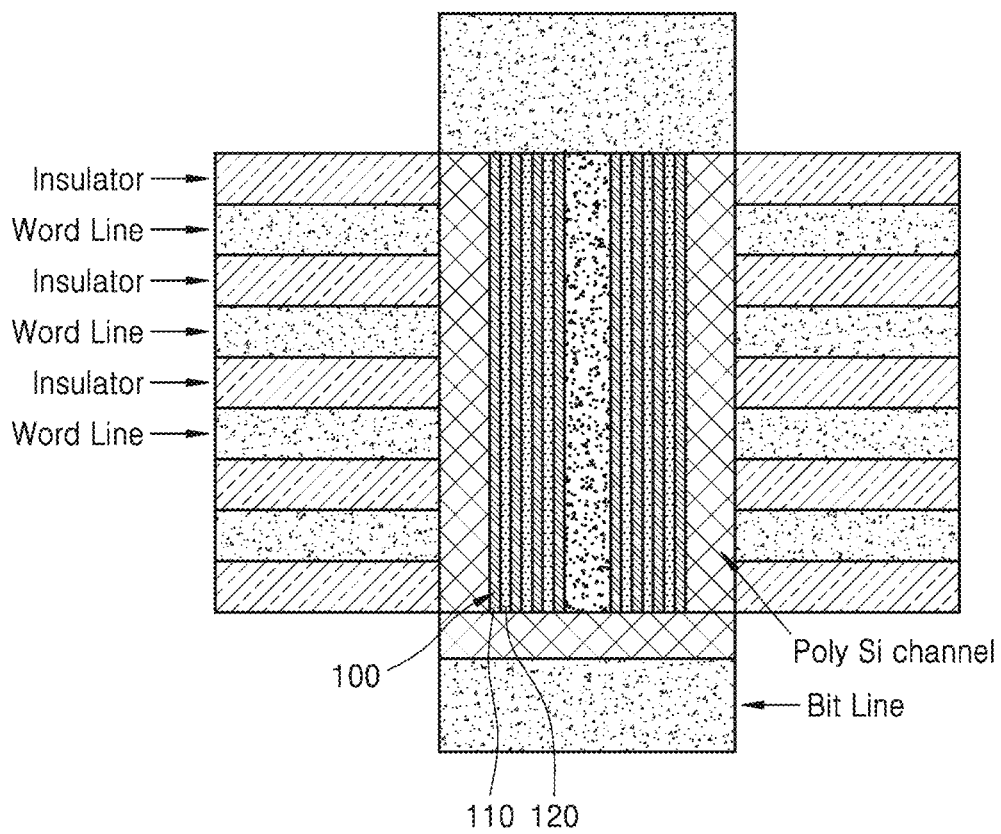
FIG. 6 is a cross-sectional view of a phase change memory device according to another embodiment.

FIG. 6 is a cross-sectional view of a phase change memory device according to another embodiment.

Referring to FIG. 6, the phase change heterostructures 100 including the phase change material layers 110 and the thermal barrier layers 120 are alternately stacked above each other in a vertical direction. The phase change heterostructures and the phase change memory devices including the same do not necessarily need to be stacked in a horizontal direction. Other details are the same as those described with reference to FIG. 1.

Figure 7:
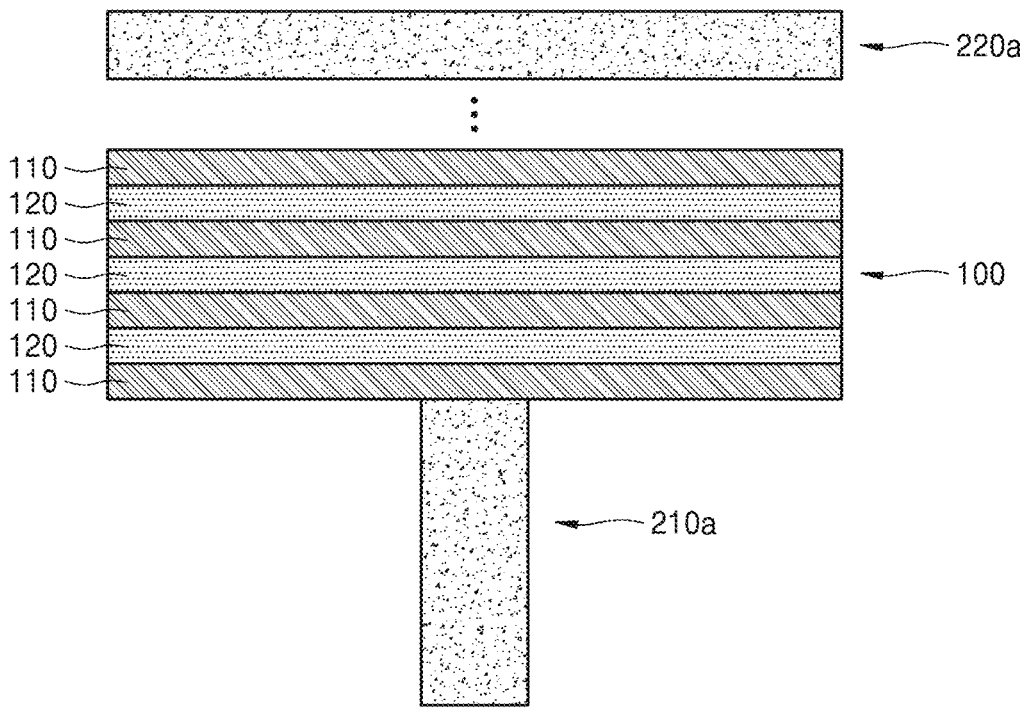
FIG. 7 is a cross-sectional view of a phase change memory device according to another embodiment.

FIG. 7 is a cross-sectional view of a phase change memory device according to another embodiment.

Referring to FIG. 7, a phase change heterostructure 100 including phase change material layers 110 and thermal barrier layers 120 is arranged, and a first electrode 210a and a second electrode 220a are arranged at a lower part of the phase change heterostructure 100 and an upper part thereof, respectively. The second electrode 220a and the first electrode 210a are arranged in a T-shaped arrangement structure.

Unlike FIGS. 1 and 6, the first electrode or the second electrode do not necessarily need to be arranged in a horizontal direction, and the plurality of electrodes may be arranged in at least one of a horizontal direction, a vertical direction, and a third direction.

Figure 8:
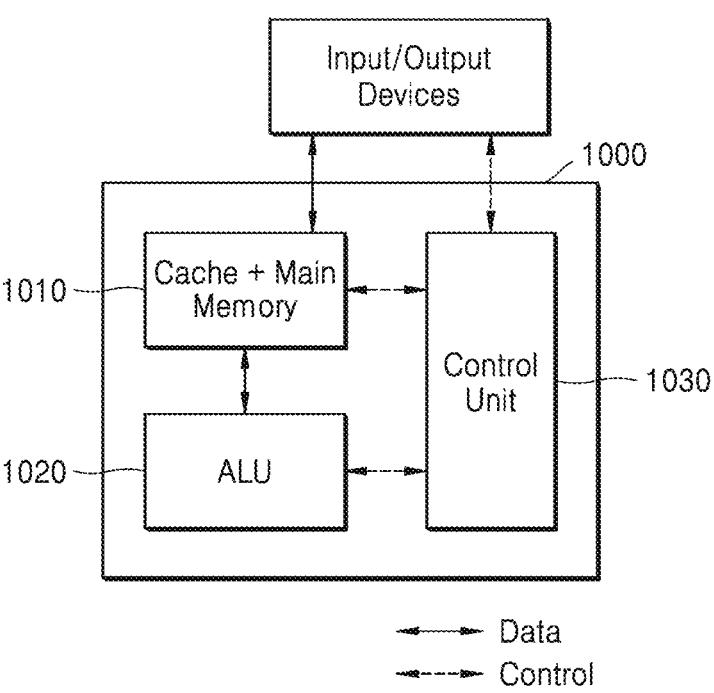
FIGS. 8 and 9 are conceptual block diagrams schematically illustrating a device architecture applicable to an electronic device according to an embodiment.
Figure 9:
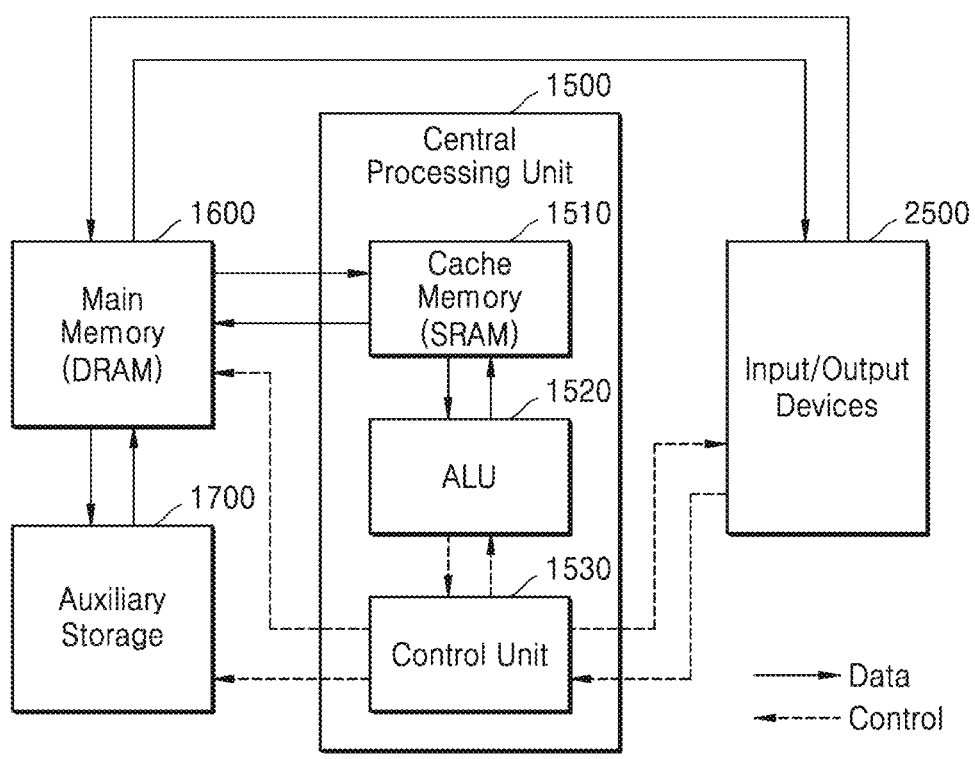

FIGS. 8 and 9 are conceptual block diagrams schematically illustrating a device architecture applicable to an electronic device according to an embodiment.

Referring to FIG. 8, the electronic device architecture 1000 may include a memory unit 1010 and a control unit 1030, and may further include an arithmetical logic unit (ALU) 1020. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. Specifically, the memory unit 1010, the ALU 1020, and the control unit 1030 may be interconnected by metal lines in an on-chip to communicate directly with each other. The memory unit 1010, the ALU 1020, and the control unit 1030 may be monolithically integrated on one substrate to form one chip. Input/output devices 2000 may be connected to the electronic device architecture (chip) 1000. In addition, the memory unit 1010 may include both a main memory and a cache memory. The electronic device architecture (chip) 1000 may be an on-chip memory processing unit. Each of the memory unit 1010, the ALU 1020, and/or the control unit 1030 may independently include a memory device according to the above-described embodiments.

Referring to FIG. 9, a cache memory 1510, an ALU 1520, and a control unit 1530 may constitute a central processing unit (CPU) 1500, and the cache memory 1510 may be a static random access memory (SRAM). Apart from the CPU 1500, a main memory 1600 and an auxiliary storage 1700 may be provided, and input/output devices 2500 may be provided. The main memory 1600 may be, for example, a dynamic random access memory (DRAM) and may include a memory device according to the above-described embodiments.

In some cases, an electronic device architecture may be implemented in a form in which computing unit devices and memory unit devices are adjacent to each other on a single chip, regardless of sub-units.

The phase change heterostructure and the memory device including the same according to an embodiment may include a plurality of phase change material layers and a plurality of thermal barrier layers, which are alternately stacked on each other, and each of the thermal barrier layers may further include a material having a thermal conductivity lower than that of a material of each of the phase change material layers, thereby reducing power consumption of the reset process according to the operation of the phase change memory device.

However, the effects of the disclosure are not limited to the above disclosure.

Although the above-described memory device and the electronic device including the same have been described with reference to the embodiments illustrated in the drawings, it will be understood by those skilled in the art that various modifications and other equivalent embodiments are possible therefrom. Therefore, the disclosed embodiments should be considered in terms of illustrative aspects rather than restrictive aspects. The scope of rights is indicated in the scope of claims, not in the aforementioned description, and all differences within the scope equivalent thereto should be interpreted as being included in the scope of rights.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A phase change heterostructure comprising:
a plurality of phase change material layers and a plurality of thermal barrier layers alternately stacked on each other, wherein a thermal conductivity of a material of the plurality of thermal barrier layers is lower than a thermal conductivity of a material of the plurality of phase change material layers, and wherein the plurality of phase change material layers and the plurality of thermal barrier layers are alternately stacked directly on each other so a corresponding one of the plurality of phase change material layers is directly connected to an overlying one of the plurality of thermal barrier layers and an underlying one of the plurality of thermal barrier layers.

2. The phase change heterostructure of claim 1, wherein the plurality of thermal barrier layers comprise a chalcogenide material having a composition of $AB_2$, wherein A is a metal element, and B is a chalcogen element.

3. The phase change heterostructure of claim 2, wherein in the composition $AB_2$, A comprises at least one of Ti, Zr, Hf, Ta, Mo, and W, and in the composition $AB_2$, B comprises at least one of Te, Se, and S.

4. The phase change heterostructure of claim 1, wherein the thermal conductivity of the material of the plurality of thermal barrier layers is 2% to 10% of the thermal conductivity of the material of the plurality of phase change material layers.

5. The phase change heterostructure of claim 1, wherein the plurality of thermal barrier layers comprise a material having a thermal conductivity of lower than 1 W/mK.

6. The phase change heterostructure of claim 1, wherein each of the plurality of thermal barrier layers has a thickness of 2 nm or more and 10 nm or less.

7. The phase change heterostructure of claim 1, wherein the plurality of phase change material layers comprise at least one of $Sb_2Te_3$ and $Ge_2Sb_2Te_5$.

8. The phase change heterostructure of claim 7, wherein the plurality of phase change material layers further include a carbon dopant.

9. The phase change heterostructure of claim 1, wherein each of the plurality of phase change material layers has a thickness of 2 nm or more and 10 nm or less.

10. A phase change memory device comprising:
a plurality of memory cells,
each of the plurality of memory cells including a first electrode, a second electrode spaced apart from the first electrode, and a phase change heterostructure between the first electrode and the second electrode,
the phase change heterostructure including a plurality of phase change material layers and a plurality of thermal barrier layers alternately stacked on each other,
wherein a thermal conductivity of a material of the plurality of thermal barrier layers is lower than a thermal conductivity of a material of the plurality of phase change material layers, and
wherein the plurality of phase change material layers and the plurality of thermal barrier layers are alternately stacked directly on each other so a corresponding one of the plurality of phase change material layers is directly connected to an overlying one of the plurality of thermal barrier layers and an underlying one of the plurality of thermal barrier layers.

11. The phase change memory device of claim 10, wherein the phase change memory device has a three-dimensional (3D) cross point array structure.

12. The phase change memory device of claim 11, wherein each of the plurality of memory cells further comprises a switching element connected in series with the phase change heterostructure.

13. The phase change memory device of claim 10, wherein the phase change memory device has a vertically stacked structure.

14. The phase change memory device of claim 10, wherein the plurality of thermal barrier layers comprise a chalcogenide material having a composition of $AB_2$, A is a metal element, and B is a chalcogen element.

15. The phase change memory device of claim 14, wherein in the composition $AB_2$, A comprises at least one of Ti, Zr, Hf, Ta, Mo, and W, and in the composition $AB_2$, B comprises at least one of Te, Se, and S.

16. The phase change memory device of claim 10, wherein the thermal conductivity of the material of the plurality of thermal barrier layers is 2% to 10% of the thermal conductivity of the material of the plurality of phase change material layers.

17. The phase change memory device of claim 10, wherein the thermal conductivity of the material of the plurality of thermal barrier layers comprise a material having a thermal conductivity of lower than 1 W/mK.

18. The phase change memory device of claim 10, wherein each of the plurality of thermal barrier layers has a thickness of 2 nm or more and 10 nm or less.

\* \* \* \* \*